United States Patent
Namkung

(10) Patent No.: US 10,680,200 B2
(45) Date of Patent: Jun. 9, 2020

(54) DISPLAY DEVICE AND MANUFACTURING METHOD THEREOF

(71) Applicant: SAMSUNG DISPLAY CO., LTD., Yongin-si, Gyeonggi-do (KR)

(72) Inventor: Jun Namkung, Yongin-si (KR)

(73) Assignee: SAMSUNG DISPLAY CO., LTD., Yongin-si, Gyeonggi-Do (KR)

( * ) Notice: Subject to any disclaimer, the term of this patent is extended or adjusted under 35 U.S.C. 154(b) by 202 days.

(21) Appl. No.: 15/646,188

(22) Filed: Jul. 11, 2017

(65) Prior Publication Data

US 2018/0019440 A1    Jan. 18, 2018

(30) Foreign Application Priority Data

Jul. 13, 2016 (KR) .......................... 10-2016-0088549

(51) Int. Cl.

| | | |
|---|---|---|
| *H01L 51/52* | (2006.01) | |
| *H01L 51/00* | (2006.01) | |
| *H01L 27/32* | (2006.01) | |
| *H01L 51/56* | (2006.01) | |

(52) U.S. Cl.
CPC ...... *H01L 51/5253* (2013.01); *H01L 27/3262* (2013.01); *H01L 27/3276* (2013.01); *H01L 51/0097* (2013.01); *H01L 51/5281* (2013.01); *H01L 51/56* (2013.01); *H01L 2251/5338* (2013.01); *Y02E 10/549* (2013.01)

(58) Field of Classification Search
CPC .................. G06F 1/1637; G06F 3/041; G06F 2203/04103; H01L 51/5256; H01L 2251/5338; H01L 51/524; H01L 51/5253; H01L 27/3262; H01L 27/3276; H01L 51/5281; H01L 51/56

See application file for complete search history.

(56) References Cited

U.S. PATENT DOCUMENTS

2013/0002583 A1 * 1/2013 Jin ........................ G06F 1/1637
345/173
2014/0002385 A1 * 1/2014 Ka ........................ G06F 1/1601
345/173

FOREIGN PATENT DOCUMENTS

| KR | 10-2013-0044177 A | 5/2013 |
|---|---|---|
| KR | 10-2014-0077818 A | 6/2014 |
| KR | 10-2014-0118676 A | 10/2014 |
| KR | 10-2014-0122960 A | 10/2014 |
| KR | 10-2014-0140150 A | 12/2014 |

(Continued)

*Primary Examiner* — Ermias T Woldegeorgis
(74) *Attorney, Agent, or Firm* — Kile Park Reed & Houtteman PLLC

(57) ABSTRACT

A display device includes a substrate including a display area, the display area including a plurality of pixels and a non-display area positioned around the display area, and the non-display area including a pad portion. A bending portion having a curvature is located in the non-display area and a first protection layer is at one surface of the bending portion having the curvature in the non-display area. A second protection layer entirely covers one surface of the bending portion having the curvature in the non-display area, the second protection layer being positioned outermost of the substrate and the first protection layer based on a center of a curvature radius of the bending portion. The second protection layer is thinner than the first protection layer. The second protection layer has a wider area than the first protection layer.

18 Claims, 8 Drawing Sheets

(56) References Cited

FOREIGN PATENT DOCUMENTS

| KR | 10-2015-0015257 A | 2/2015 |
|----|-------------------|--------|
| KR | 10-2015-0026709 A | 3/2015 |

\* cited by examiner

Corrosion generation

DISPLAY DEVICE AND MANUFACTURING METHOD THEREOF

CROSS-REFERENCE TO RELATED APPLICATION

Korean Patent Application No. 10-2016-0088549, filed on Jul. 13, 2016, in the Korean Intellectual Property Office, and entitled: "Display Device and Manufacturing Method Thereof," is incorporated by reference herein in its entirety.

BACKGROUND

1. Field

Embodiments relate to a display device and a manufacturing method of a display device, and in detail, relates to a display device reducing a bezel width and a manufacturing method thereof.

2. Description of the Related Art

Display devices such as organic light emitting devices and liquid crystal displays are manufactured by generating a plurality of layers and elements on a substrate. A glass substrate, as a substrate of the display device, is heavy and easily broken. Further, a glass substrate is rigid such it is difficult to deform the display device. A flexible substrate, on the other hand, is light, resistant to damage from impacts, and easily deformed.

SUMMARY

Embodiments are directed to a display device including a substrate including a display area, the display area including a plurality of pixels and a non-display area positioned around the display area, and the non-display area including a pad portion. A bending portion having a curvature is located in the non-display area and a first protection layer is at one surface of the bending portion having the curvature in the non-display area. A second protection layer entirely covers one surface of the bending portion having the curvature in the non-display area, the second protection layer being positioned outermost of the substrate and the first protection layer based on a center of a curvature radius of the bending portion. The second protection layer is thinner than the first protection layer. The second protection layer has a wider area than the first protection layer.

The second protection layer may include at least one of a fluorine component and an acryl component.

The bending portion may be on at least one of sides of the substrate.

The thickness of the second protection layer may be from 0.1 μm to 5 μm.

The thickness of the first protection layer may be from 90 μm to 110 μm. The first protection layer may include a polymer.

The second protection layer may be on the first protection layer and may cover an entire surface of the first protection layer.

The display device may further include a polarizer on the substrate. The second protection layer may cover a side surface of the polarizer in addition to covering the surface of the first protection layer.

The second protection layer may include a material that is a mixture of an acrylic resin and fluorine or a fluoroplastic.

The display device may further include a third protection layer facing the second protection layer. The substrate may be between the third protection and the first protection layer.

The third protection layer may include at least one of a fluorine component and an acryl component.

The third protection layer may be positioned innermost of the substrate, the first protection layer and the second protection layer based on the center of the curvature radius.

The thickness of the third protection layer may be from 0.1 μm to 5 μm.

The display device may further include a plurality of thin film transistors connected to the plurality of pixels, a plurality of signal lines connected to the plurality of thin film transistors and positioned on the substrate in the non-display area, and an inorganic layer covering the plurality of signal lines. Portions of the inorganic layer are not connected to each other between the plurality of signal lines.

The display device may further include a common electrode facing the pixel electrode, an organic light emitting element between the pixel electrode and the common electrode, and a thin film encapsulation layer on the common electrode.

Embodiments are also directed to a method for manufacturing a display device including preparing a substrate including a display area including a plurality of pixels and a non-display area positioned around the display area and including a plurality of signal lines and a pad portion, forming a first protection layer on the plurality of signal lines, forming a second protection layer to cover a surface of the first protection layer, the second protection layer being made of a material including at least one of fluorine and an acryl component, the second protection layer being thinner than the first protection layer, irradiating ultraviolet rays onto the second protection layer, and bending the non-display area of the substrate.

The second protection layer may be formed to a thickness of 0.1 μm to 5 μm.

The first protection layer may be formed to a thickness of 90 μm to 110 μm.

The method may further include attaching a polarizer onto the display area after preparing the substrate. The second protection layer may be formed to cover the side surface of the polarizer and the surface of the first protection layer.

Forming the second protection layer may include wet coating, spray coating, or jet coating.

BRIEF DESCRIPTION OF THE DRAWINGS

Features will become apparent to those of skill in the art by describing in detail exemplary embodiments with reference to the attached drawings in which.

DETAILED DESCRIPTION

Figure 1:
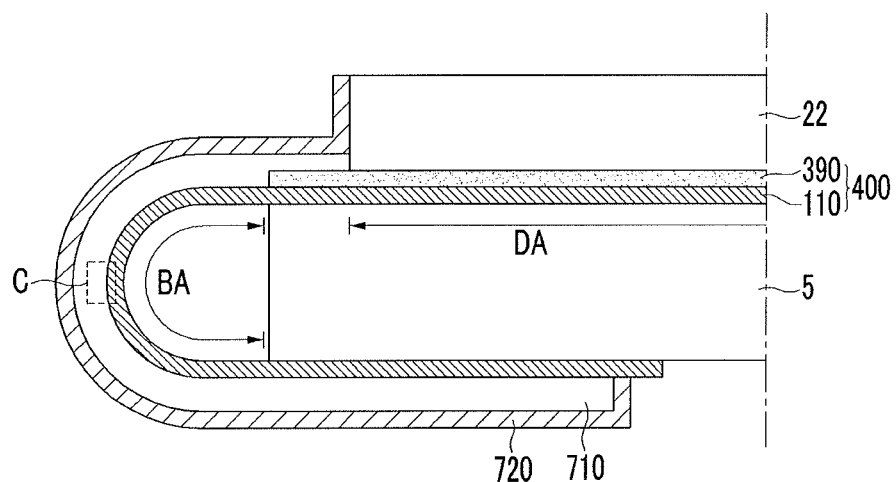
FIG. 1 illustrates a partial side view of a display device according to an exemplary embodiment.

Example embodiments will now be described more fully hereinafter with reference to the accompanying drawings; however, they may be embodied in different forms and should not be construed as limited to the embodiments set forth herein. Rather, these embodiments are provided so that this disclosure will be thorough and complete, and will fully convey exemplary implementations to those skilled in the art.

In the drawing figures, the dimensions of layers and regions may be exaggerated for clarity of illustration. It will also be understood that when a layer or element is referred to as being "on" another layer or substrate, it can be directly on the other layer or substrate, or intervening layers may also be present. Further, it will be understood that when a layer is referred to as being "under" another layer, it can be directly under, and one or more intervening layers may also be present. In addition, it will also be understood that when a layer is referred to as being "between" two layers, it can be the only layer between the two layers, or one or more intervening layers may also be present. Like reference numerals refer to like elements throughout.

A display device according to an exemplary embodiment will now be described with reference to FIG. 1 to FIG. 4B.

Figure 2:
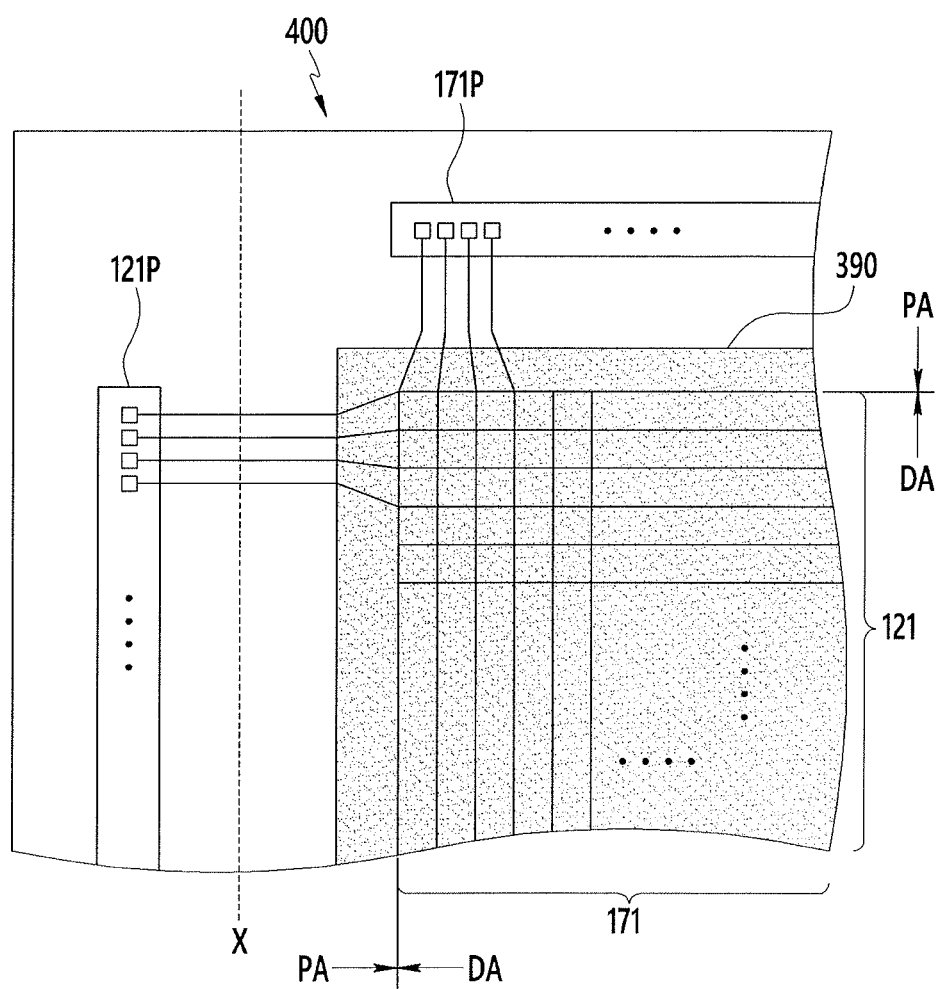
FIG. 2 illustrates a top plan view schematically showing a substrate before bending in a display device according to an exemplary embodiment.
Figure 3:
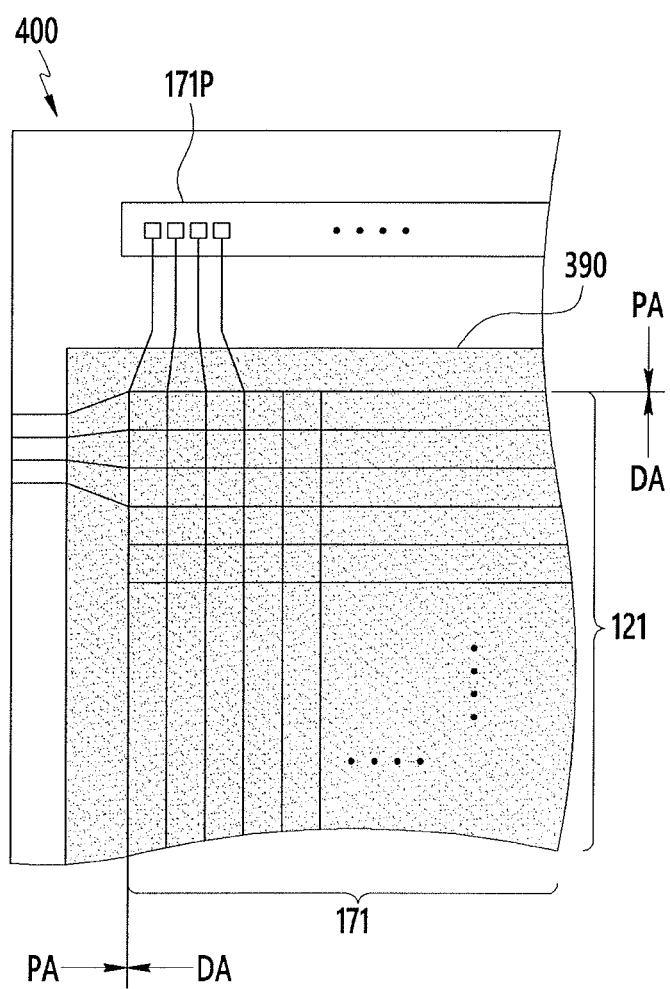
FIG. 3 illustrates a top plan view schematically showing a substrate of a bent portion in a display device according to an exemplary embodiment.
Figure 4A:
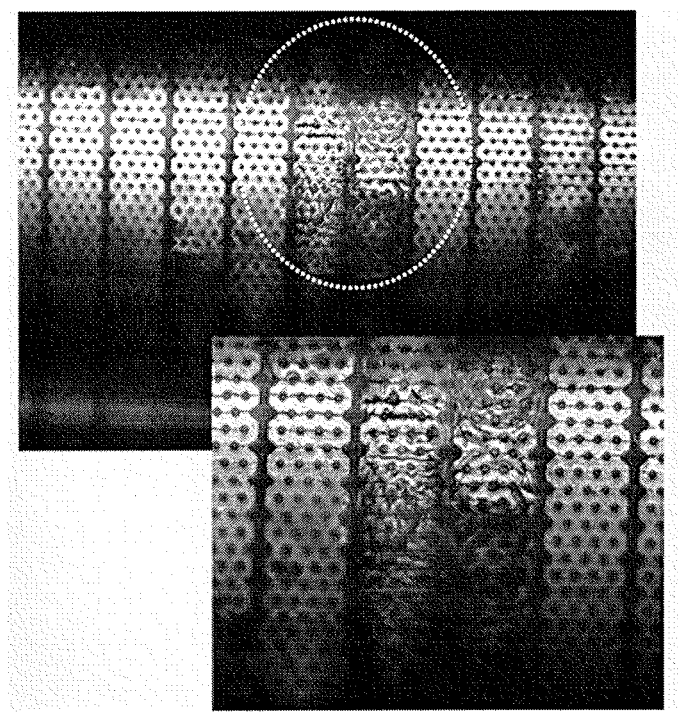
FIGS. 4A and 4B illustrate a respective comparison photos picturing a bending portion of a display device of a comparative example and an exemplary embodiment.
Figure 4B:
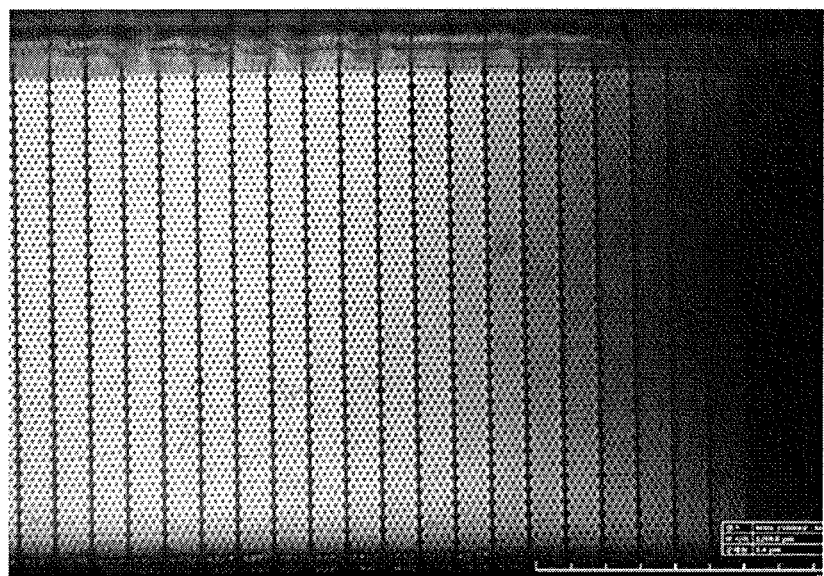

FIG. 1 illustrates a partial side view of a display device according to an exemplary embodiment. FIG. 2 illustrates a top plan view schematically showing a substrate before bending in a display device according to an exemplary embodiment. FIG. 3 illustrates a top plan view schematically showing a substrate of a bent portion in a display device according to an exemplary embodiment. FIGS. 4A and 4B illustrate a comparative images picturing a bending portion of a display device according to a comparative example (FIG. 4A) and an exemplary embodiment (FIG. 4B).

Referring to FIG. 1, the display device according to an exemplary embodiment may include a display panel 400, a polarizer 22, a first protection layer 710, a second protection layer 720. The display panel 400 may include a substrate 110 and a thin film encapsulation layer 390.

Referring to FIG. 2 and FIG. 3, the substrate 110 may be a flexible substrate made of plastic. The substrate 110 may include a display area DA and a non-display area PA enclosing the display area DA. The display area DA may be a region that displays an image by outputting the image. The non-display area PA may be a region where elements and/or wires to generate and/or transmit various signals applied to the display area DA are located.

A gate pad portion 121P and a data pad portion 171P to receive signals from the outside of the display panel 400 may be positioned in the non-display area PA. The gate pad portion 121P may include at least one gate pad portion connected to an external circuit. The data pad portion 171P may include at least one data pad portion connected to an external circuit. The gate pad portions 121P and the data pad portions 171P may be disposed at predetermined intervals along edges of the substrate 110. A gate line 121 may be connected to the gate pad portion 121P and a data line 171 may be connected to the data pad portion 171P.

The pad portions 121P and 171P may be connected to one end of respective flexible printed circuit films (FPCs). The other end of the respective flexible printed circuit films may be connected to, for example, printed circuit boards (PCBs) to transmit signals such as a control signal or an image data.

A driving device that generates and/or processes various signals to drive the display panel 400 may be positioned at the non-display area PA of the display panel 400 or at the flexible printed circuit film or the printed circuit board (PCB). The driving device may include a data driver to apply a data signal to the data line, a gate driver to apply a gate signal to the gate line, and a signal controller controlling the data driver and the gate driver.

A plurality of pixels may be disposed in a matrix, for example, in the display area DA of the substrate 110. A plurality of thin film transistors (TFT) such as a switching transistor, a driving transistor, or the like may be disposed in each pixel.

In the display area DA, the gate lines 121 may extend in one direction (e.g., a row direction), and the data lines 171 may extend in a direction vertically crossing the gate lines 121 (e.g., a column direction). In the display area DA, the gate lines 121 and the data lines 171 connected to the plurality of pixels may respectively extend to the non-display area PA to be connected to the gate pad portion 121P and the data pad portion 171P.

The plurality of pixels may receive the gate signal through the gate line 121 connected to the gate pad portion 121P and may receive the data signal through the data line 171 connected to the data pad portion 171P to be driven. A control terminal of a switching transistor may be connected to the gate line 121, an input terminal thereof may be connected to the data line 171, and an output terminal thereof may be connected to the driving transistor. The switching transistor may transmit the data signal transmitted from the data line 171 to the driving transistor in response to the gate signal transmitted from the gate line 121. The control terminal of the driving transistor may be connected to the switching transistor, the input terminal thereof may be connected to a driving voltage line, and the output terminal thereof may be connected to an organic light emitting element. The driving transistor may provide an output current having an intensity that is differentiated depending on the voltage applied between the control terminal and the output terminal. The organic light emitting element may be positioned on the display area DA of the substrate 110, for example, as an organic light emitting diode (OLED). The organic light emitting element may include an anode connected to the output terminal of the driving transistor and a cathode connected to a common voltage. The organic light emitting element may display an image by emitting light, the strength of which varies depending on the output current of the driving transistor. The organic light emitting element may include an organic material that uniquely emits light of one of primary colors such as three primary colors of red, green, and blue. The organic light emitting diode display may display a desired image according to a spatial sum of these colors.

The thin film encapsulation layer 390 may be positioned to face the substrate 110 via the organic light emitting element, and may protect the organic light emitting element by preventing oxygen and moisture from entering from the outside.

Referring to FIG. 1 to FIG. 3, the display panel 400 may be bent based on a bending axis X. The display panel may include a bending portion BA having a curvature. For example, as shown in FIG. 2, the bending axis X may be positioned at the non-display area PA of the substrate 110. FIG. 2 illustrates the shape of the display panel 400 before the substrate 110 is bent at the bending axis X. When the substrate 110 is bent at the bending axis X, at least one part of the non-display area PA may have the curvature, and the pad portions 121P and 171P and/or the signal lines 121 and 171 on the non-display area PA may be bent along with the substrate 110. FIG. 3 illustrates the shape after the substrate 110 of FIG. 2 is bent at the bending axis X. When the substrate 110 is bent at the bending axis X, the flexible printed circuit film may be positioned behind the display area DA. One or more among the pad portions 121P and 171P and the signal lines 121 and 171 may be positioned on the bending portion BA. In some implementations, all of the pad portions 121P and 171P and the signal lines 121 and 171 may be positioned on the bending portion BA depending on the position of the bending axis X and the bending curvature.

A polarizer 22 for polarizing light may be positioned on the display panel 400 at a location corresponding to the display area DA. A structure 5 may be positioned under the display panel 400. The structure 5 may be positioned at a space generated from bending the substrate 110. The structure 5 may support the bent substrate 110 and may serve as a desiccant.

The first protection layer 710 may neutralize a stress due to the bending of the substrate 110. The first protection layer 710 may be positioned on the bending portion BA of the non-display area PA. The first protection layer 710 may cover the surface of the bending portion BA, and may cover part of the signal lines 121 and 171 and/or the pad portions 121P and 171P that are positioned on the bending portion BA and that are bent along the bending portion BA. The first protection layer 710 may cover all of one surface of the bending portion BA and all of the signal lines 121 and 171 and/or the pad portions 121P and 171P positioned on the bending portion BA. In addition, the first protection layer 710 may cover the non-display area PA as well as the bending portion BA, and may cover the signal lines 121 and 171 and/or the pad portions 121P and 171P that are positioned on the non-display area PA. The first protection layer 710 may cover the surface of the thin film encapsulation layer 390 as well as the non-display area PA, and may cover the position where the polarizer 22 is located along the surface of the thin film encapsulation layer 390. The first protection layer 710 may include a polymer. A thickness of the first protection layer 710 may be about 90 μm to 110 μm.

The second protection layer 720 may protect the signal lines 121 and 171 and/or the pad portions 121P and 171P from corrosion. The second protection layer 720 may be positioned on the bending portion BA of the non-display area PA. The second protection layer 720 may cover the surface of the bending portion BA and may cover the signal lines 121 and 171 and/or the pad portions 121P and 171P that are positioned on the bending portion BA and that bent along with the bending portion BA. The second protection layer 720 may entirely cover one surface of the bending portion BA, and may entirely cover the signal lines 121 and 171 and/or the pad portions 121P and 171P positioned on the bending portion BA. The second protection layer 720 may be positioned outermost based on a center of the curvature radius of the bending portion BA.

The second protection layer 720 may cover the non-display area PA as well as the bending portion BA, and may cover the signal lines 121 and 171 and/or the pad portions 121P and 171P positioned on the non-display area PA. In addition, the second protection layer 720 may cover the surface of the thin film encapsulation layer 390 as well as the non-display area PA, and may cover the portion where the polarizer 22 is positioned along the surface of the thin film encapsulation layer 390. The second protection layer 720 may cover the surface of the first protection layer 710 and may cover the entire surface of the first protection layer 710 so as to not expose the surface of the first protection layer 710. The second protection layer 720 may enclose a corner portion where the first protection layer 710 ends. The second protection layer 720 may cover the side surface of the polarizer 22 positioned on the thin film encapsulation layer 390 while covering the surface of the first protection layer 710. The second protection layer 720 may be thinner than the first protection layer 710. For example, the thickness of the second protection layer 720 may be about 0.1 μm to 5 μm.

The second protection layer 720 may include at least one of a fluorine component and an acryl component. The second protection layer 720 may include a fluoroplastic, and may include a material in which an acryl resin is mixed with fluorine or the fluoroplastic. The second protection layer 720 may include a polymer of the acryl, and may include a cellulose resin. The second protection layer 720 may include one or more of PTFE (polytetrafluoroethylene), a PFA (perfluoroalkoxy alkane) polymer, a FEP (fluorinated ethylene propylene) copolymer, and an ETFE (ethylene tetrafluoroethylene) copolymer. As an exemplary embodiment, the second protection layer 720 may formed of a material including fluorine at 45 wt % to 83 wt %, an acryl at 15 wt % to 25 wt %, xylene at 1 wt % to 10 wt %, and ethyl benzene at 1 wt % to 10 wt %. Other components may be further included, and a sum value of the amount (wt %) of fluorine, acryl, xylene, and ethyl benzene included in the second protection layer 720 may not exceed 100 wt %.

When the display device includes a dual layer of the first protection layer 710 and the second protection layer 720, the bending stress of the bending portion and the signal line and/or the pad portion that are positioned on the bending portion may be neutralized, thereby preventing corrosion. For example, the first protection layer 710 may neutralize the stress due to the bending of the bending portion as a first step, thereby helping to prevent damage such as a crack of the bending portion. When the second protection layer 720 is then formed to cover the outermost portion based on the center of the curvature radius of the bending portion, the bending portion may prevent the moisture from penetrating into the bending portion such that the bending portion may be prevented from being corroded. When the second protection layer 720 is formed with a wide area, the corrosion preventing effect may be great. When the second protection layer 720 covers the entire surface of the first protection layer 710 such that the surface of the first protection layer 710 is not exposed, and when the protection layer 720 is formed to enclose the corner portion where the first protection layer 710 ends, the corrosion may be most effectively prevented. The second protection layer 720 may include fluorine. Accordingly, a protection layer having excellent chemical robustness, durability, and chemical resistance may be formed due to the excellent molecular bonding force of the fluorine. When the acryl resin is mixed therein, an excellent moisture proofing function may be provided.

FIG. 4A illustrates an image of the bending portion of the display device of a comparative example that does not have the first protection layer and the second protection layer. FIG. 4B illustrates an image of the bending portion of a display device that includes the first protection layer and the second protection layer. In the display device of the comparative example not having the first protection layer and the second protection layer, it may be confirmed in FIG. A that corrosion is generated in the bending portion. In the case of the display device including the first protection layer and the second protection layer, it may be confirmed in FIG. B that corrosion is not generated in the bending portion. Accordingly, it is believed that when the first protection layer and the second protection layer are formed in the display device, stress due to the bending of the non-display area may be reduced, and the corrosion of the bending portion may be prevented or reduced, thereby improving the reliability of the pad portion, the signal line, or the like.

In the present exemplary embodiment, an organic light emitting device is described as an example. In some implementations, the display panel may be a liquid crystal panel instead of an organic light emitting panel. In the case of the liquid crystal panel, the display panel may include a substrate, a liquid crystal layer including liquid crystal molecules, and a facing substrate. The substrate may include a switching transistor in which the control terminal is connected to the gate line. The input terminal is connected to the data line, and the output terminal is connected to the pixel electrode. The liquid crystal panel may display various images by controlling a slope of the liquid crystal molecules in response to an electric field formed between the pixel electrode receiving the data voltage and the common electrode receiving the common voltage. In some implementations, the display panel may be configured by positioning a plurality of roof layers instead of the facing substrate and the liquid crystal layer in a plurality of microcavities between the plurality of roof layers and the substrate.

In the present exemplary embodiment, the non-display area portion at the left side of the substrate is bent. In some implementations, the right side, the upper side, or the lower side of the substrate may be bent, and part of the display area over the peripheral area may be bent. For example, the bending portion may be positioned at at least one among a plurality of sides of the substrate.

The display device according to an exemplary embodiment will be described with reference to FIG. 1 and FIG. 5. The description of configurations that are the same as in the above-described exemplary embodiment will not be repeated.

Figure 5:
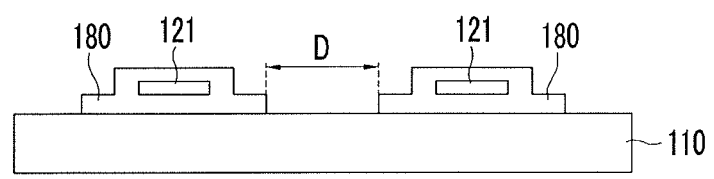
FIG. 5 illustrates an enlarged view of a substrate of a region C of FIG. 1.

FIG. 5 illustrates an enlarged view of a substrate of a region C of FIG. 1.

A plurality of signal lines and/or the pad portion may be positioned at the surface of the bending portion BA of the substrate 110. The region C may represent a portion where the gate line 121 passes along the surface of the bending portion BA. The gate line 121 at the surface of the bending portion BA may be covered by an inorganic layer 180 that is not connected at a part D between the gate lines 121. For example, the inorganic layer 180 may be formed to cover the gate line 121 along the gate line 121 at the surface of the bending portion BA. The inorganic layer 180 may be absent in the region where the wiring does not exist between the gate lines 121. The gate line 121 is described as an example. A plurality of signal lines positioned at the surface of the bending portion BA may be covered by the inorganic layer and the inorganic layer may be absent in the region where the signal line does not exist between the signal lines. Accordingly, in the region where the signal line does not exist, the inorganic layer is absent The inorganic layer covering the signal line may be minimized along the signal line. Accordingly, even thought the bending stress may increase due to the inorganic layer of the bending portion, crack generation of the inorganic layer, and the like may be minimized, and an outer shell over the signal line may be formed such that the signal line is effectively protected from the corrosion. In this case, even if the inorganic layer 180 is not positioned at the part D between the wires, the first protection layer 710 and the second protection layer 720 covering the bending portion BA may prevent the moisture from flowing into the part D between the wires.

Next, the display device according to an exemplary embodiment will be described with reference to FIG. 6. The description of configurations that are the same as in the above-described exemplary embodiment will not be repeated.

Figure 6:
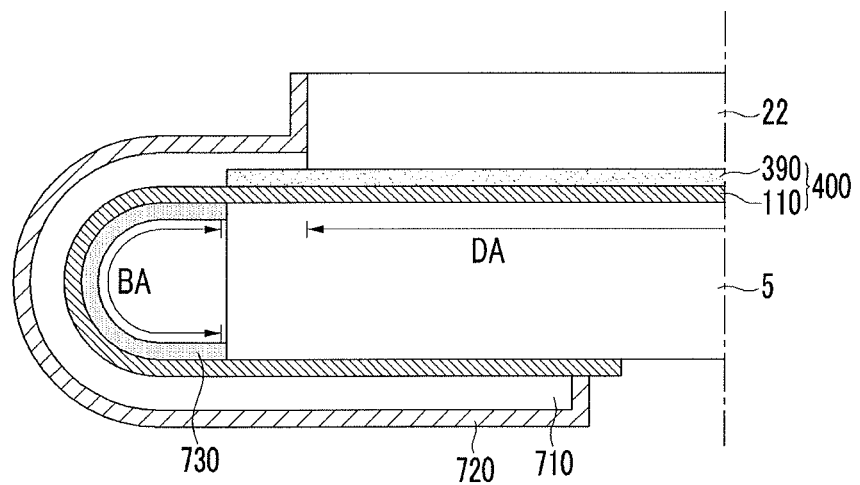
FIG. 6 illustrates a side view showing a portion of a display device according to an exemplary embodiment.

FIG. 6 illustrates a side view showing a portion of a display device according to an exemplary embodiment.

A third protection layer 730 facing the second protection layer 720 via the substrate 110 may be positioned at the bending portion BA of the non-display area PA. The third protection layer 730 may cover the surface of the bending portion BA, and may be positioned at the surface opposite to the surface in which the second protection layer 720 is positioned at the substrate 110. The third protection layer 730 may cover the entire surface of the bending portion BA and may be positioned innermost based with regard to the center of the curvature radius of the bending portion BA.

The third protection layer 730 may entirely cover the exposed surface of the substrate 110 so as to not expose the surface of the substrate 110, and may cover the location where the structure 5 is positioned. The third protection layer 730 may be thinner than the first protection layer 710. For example, the thickness of the third protection layer 730 may be from about 0.1 μm to about 5 μm.

The third protection layer 730 may include at least one of the fluorine component and the acryl component. The third protection layer 730 may include a fluoroplastic, and may include the material in which the acryl resin is mixed with fluorine or the fluoroplastic. The third protection layer 730 may include the polymer of the acryl and may include the cellulose polymer. The third protection layer 730 may include one or more among PTFE (polytetrafluoroethylene), a PFA (perfluoroalkoxy alkane) polymer, FEP (fluorinated ethylene propylene) copolymers, and FIFE (ethylene tetrafluoroethylene) copolymers. The third protection layer 730 as an exemplary embodiment may be formed of a fluorine-containing material at 45 wt % to 83 wt %, an acryl at 15 wt % to 25 wt %, xylene at 1 wt % to 10 wt %, and ethyl benzene at 1 wt % to 10 wt %. Other components may be further included, and a sum value of the amount (wt %) of fluorine-containing material, acryl, xylene, and ethyl benzene included in the second protection layer 720 may not exceed 100 wt %.

In this way, by further forming the third protection layer 730 at the bending portion BA, the bending stress neutralizing effect and the anti-corrosion effect of the bending portion BA and the signal line and/or the pad portion positioned at the bending portion BA of the display device may be increased.

Next, the display device according to an exemplary embodiment will be described with reference to FIG. 7. The description of configurations that are the same as in the above-described exemplary embodiment will not be repeated.

Figure 7:
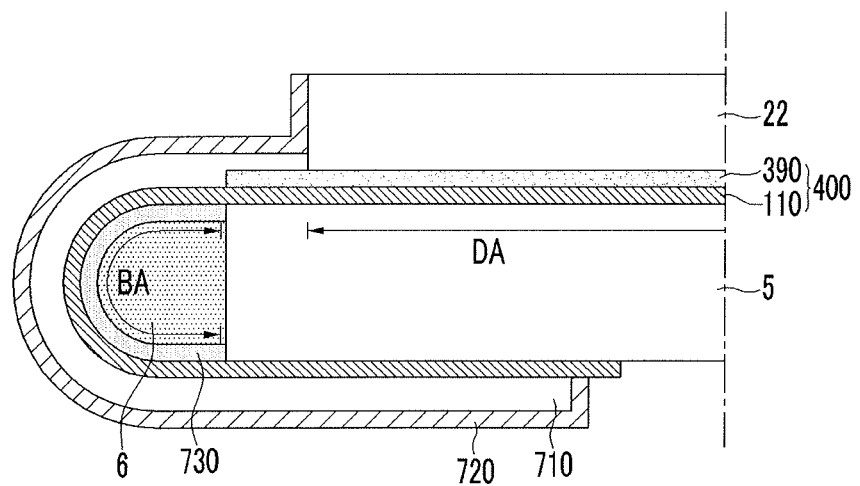
FIG. 7 illustrates a side view showing a portion of a display device according to an exemplary embodiment.

FIG. 7 is a side view showing a portion of a display device according to an exemplary embodiment.

A getter 6 may be located inside the bending portion BA of the substrate 110. The getter 6 may be positioned at an inside space of the bending portion BA generated by bending the substrate 110. The getter 6 may have a function of supporting the shape of the bending portion BA of the bent substrate 110 and may act as the desiccant. The getter 6 may have a curvature that matches the inside space of the bending portion BA.

When the getter 6 is inserted inside the bending portion BA, the moisture proofing effect is increased such that the corrosion preventing effect of the bending portion BA may be increased.

Next, a manufacturing method of the display device according to an exemplary embodiment will be described with reference to FIG. 1. The description of configurations that are the same as in the above-described exemplary embodiment will not be repeated.

To manufacture the display device according to an exemplary embodiment, the flexible substrate 110 including the display area DA to display an image and the non-display area where the plurality of signal lines and pad portions are positioned may be provided. The thin film encapsulation layer 390 is formed on the display area DA of the substrate 110. The polarizer 22 may be attached to the portion corresponding to the display area DA on the thin film encapsulation layer 390.

The first protection layer 710 may be formed on the non-display area where the plurality of signal lines and the pad portions of the substrate 110 are positioned to neutralize stress due to the bending of the substrate 110. The first protection layer 710 may be formed of the material including the polymer, as described above, and have the thickness of about 90 μm to 110 μm. The first protection layer 710 may be formed to cover the surface of the non-display area and may be formed to cover the plurality of signal lines and/or the pad portions positioned on the non-display area. The first protection layer 710 may be formed to entirely cover the plurality of signal lines and/or the pad portions positioned on the non-display area. The first protection layer 710 may be formed to cover the surface of the thin film encapsulation layer 390 as well as the non-display area, and may be formed up to where the polarizer 22 is positioned along the surface of the thin film encapsulation layer 390.

The second protection layer 720 protecting the signal line and/or the pad portion from the corrosion may be formed on the first protection layer 710 of the non-display area. The second protection layer 720 may be deposited by a suitable method, such as wet coating, spray coating, or jet coating. The second protection layer 720 may be thinner than the first protection layer 710. For example, the second protection layer 720 may be about 0.1 μm to 5 μm. The second protection layer 720 may be formed to be positioned at the uppermost layer of the non-display area of the substrate 110.

The second protection layer 720 may formed to cover the surface of the non-display area and to cover the plurality of signal lines and/or the pad portions positioned on the non-display area. The second protection layer 720 may be formed to cover the surface of the thin film encapsulation layer 390 as well as the non-display area, and may be formed to cover the side surface of the polarizer 22 positioned on the thin film encapsulation layer 390 while covering the position where the polarizer 22 is positioned along the surface of the film encapsulation layer 390. The second protection layer 720 may be formed to cover the entire surface of the first protection layer 710 so as to not expose the surface of the first protection layer 710. The second protection layer 720 may be formed to enclose the corner portion where the first protection layer 710 ends.

The second protection layer 720 may be formed of the material including at least one of the fluorine component and the acryl component. The second protection layer 720 may be formed of the material including the fluoroplastic, and may include the material of which the acryl resin is mixed with fluorine or the fluoroplastic. The second protection layer 720 may be formed of the material including the polymer of the acryl, and may be formed of the material including the cellulose resin. The second protection layer 720 may be formed by including one or more among PTFE (polytetrafluoroethylene), a PFA (perfluoroalkoxy alkane) polymer, FEP (fluorinated ethylene propylene) copolymers, and ETFE (ethylene tetrafluoroethylene) copolymers. As an exemplary embodiment, the second protection layer 720 may be formed of the fluorine-containing material, an acryl, xylene, and ethyl benzene. As an exemplary embodiment, the second protection layer 720 may formed of a fluorine-containing material at 45 wt % to 83 wt %, an acryl at 15 wt % to 25 wt %, xylene at 1 wt % to 10 wt %, and ethyl benzene at 1 wt % to 10 wt %. Other components may be further included, and a sum value of amounts (wt %) of the fluorine-containing material, acryl, xylene, and ethyl benzene included in the second protection layer 720 may not exceed 100 wt %.

After depositing the second protection layer 720, ultraviolet rays may be irradiated to the second protection layer 720, and the non-display area of the substrate 110 may be bent to form the bending portion BA.

By way of summation and review, a display device using a flexible substrate may be designed so as to bend in a non-display area that includes a pad portion to which a flexible printed circuit film (FPC) to transmit a signal is attached. Thereby a dead space may be reduced compared with a display device having a rigid substrate. When the dead space is reduced, the bezel width of the display device may be reduced and utilization of an inner space of the display device increases, thereby allowing the display device to be more compact.

Embodiments improve the reliability of a pad portion of the non-display area and a signal line in the display device including the flexible substrate.

According to embodiments, in the display device including the flexible substrate, stress due to the bending of the non-display area may be reduced and corrosion of the bending portion may be prevented, thereby improving the reliability of the pad portion, the signal line, and the like Example embodiments have been disclosed herein, and although specific terms are employed, they are used and are to be interpreted in a generic and descriptive sense only and not for purpose of limitation. In some instances, as would be apparent to one of ordinary skill in the art as of the filing of the present application, features, characteristics, and/or elements described in connection with a particular embodiment may be used singly or in combination with features, characteristics, and/or elements described in connection with other embodiments unless otherwise specifically indicated. Accordingly, it will be understood by those of skill in the art that various changes in form and details may be made without departing from the spirit and scope thereof as set forth in the following claims.

What is claimed is:

1. A display device, comprising:
 a substrate including a display area, the display area including a plurality of pixels and a non-display area positioned around the display area, the non-display area including a pad portion, and wherein a bending portion having a curvature is located in the non-display area;
 a first protection layer at one surface of the bending portion having the curvature in the non-display area; and
 a second protection layer entirely covering one surface of the bending portion having the curvature in the non-display area, the second protection layer being positioned outermost of the substrate and the first protection layer based on a center of a curvature radius of the bending portion, wherein:

the second protection layer is on the first protection layer and covers an entire surface of the first protection layer including a side end surface of the first protection layer, the second protection layer is thinner than the first protection layer, the second protection layer has a wider area than the first protection layer, and the second protection layer has at least one end portion which directly contacts the substrate.

2. The display device as claimed in claim 1, wherein:
the second protection layer includes at least one of a fluorine component and an acryl component.

3. The display device as claimed in claim 2, wherein:
the bending portion is on at least one of sides of the substrate.

4. The display device as claimed in claim 3, wherein:
a thickness of the second protection layer is from 0.1 μm to 5 μm.

5. The display device as claimed in claim 3, further comprising:
a third protection layer facing the second protection layer, the substrate being between the third protection and the first protection layer.

6. The display device as claimed in claim 5, wherein:
the third protection layer includes at least one of a fluorine component and an acryl component.

7. The display device as claimed in claim 6, wherein:
the third protection layer is positioned innermost of the substrate, the first protection layer and the second protection layer based on the center of the curvature radius.

8. The display device as claimed in claim 7, wherein:
a thickness of the third protection layer is from 0.1 μm to 5 μm.

9. The display device as claimed in claim 4, wherein:
a thickness of the first protection layer is from 90 μm to 110 μm, and
the first protection layer includes a polymer.

10. The display device as claimed in claim 3, wherein:
the second protection layer includes a material that is a mixture of an acrylic resin and fluorine or a fluoroplastic.

11. The display device as claimed in claim 3, further comprising:
a plurality of thin film transistors connected to the plurality of pixels;
a plurality of signal lines connected to the plurality of thin film transistors and positioned on the substrate in the non-display area; and
an inorganic layer covering the plurality of signal lines, portions of the inorganic layer not being connected to each other between the plurality of signal lines.

12. The display device as claimed in claim 3, further comprising:
a pixel electrode and a common electrode facing the pixel electrode;
an organic light emitting element between the pixel electrode and the common electrode; and
a thin film encapsulation layer on the common electrode.

13. The display device as claimed in claim 1, further comprising:
a polarizer on the substrate, wherein the second protection layer covers a side end surface of the polarizer in addition to covering the surface of the first protection layer.

14. A method for manufacturing a display device, the method comprising:
preparing a substrate including a display area including a plurality of pixels and a non-display area positioned around the display area and including a plurality of signal lines and a pad portion;
forming a first protection layer on the plurality of signal lines;
forming a second protection layer to cover a surface of the first protection layer, the second protection layer being made of a material including at least one of fluorine and an acryl component, the second protection layer being thinner than the first protection layer;
irradiating ultraviolet rays onto the second protection layer; and
bending the non-display area of the substrate.

15. The method as claimed in claim 14, wherein:
the second protection layer is formed to a thickness of 0.1 μm to 5 μm.

16. The method as claimed in claim 15, wherein:
the first protection layer is formed to a thickness of 90 μm to 110 μm.

17. The method as claimed in claim 14, further comprising:
attaching a polarizer onto the display area after preparing the substrate, the second protection layer being formed to cover the side surface of the polarizer and the surface of the first protection layer.

18. The method as claimed in claim 14, wherein:
forming the second protection layer includes wet coating, spray coating, or jet coating.

* * * * *